(12) United States Patent
Zeng et al.

(10) Patent No.: US 12,013,430 B1
(45) Date of Patent: Jun. 18, 2024

(54) DETECTION METHOD FOR WIRING RELATIONSHIP OF ELECTRICAL COMPONENTS

(71) Applicant: Guangdong Yang Dili Electric Technology Co., Ltd., Guangzhou (CN)

(72) Inventors: SiPing Zeng, Guangzhou Guangdong (CN); YongDe Chen, Jiangmen Guangdong (CN); YuKai Li, Zhanjiang Guangdong (CN)

( * ) Notice: Subject to any disclaimer, the term of this patent is extended or adjusted under 35 U.S.C. 154(b) by 0 days.

(21) Appl. No.: 18/408,034

(22) Filed: Jan. 9, 2024

(30) Foreign Application Priority Data

Jan. 9, 2023 (CN) .......................... 202310026141.X

(51) Int. Cl.
  *G01R 31/28* (2006.01)
  *G01R 31/55* (2020.01)
  *G01R 35/02* (2006.01)
(52) U.S. Cl.
  CPC ................. *G01R 31/2834* (2013.01)
(58) Field of Classification Search
  CPC .... G01R 31/02; G01R 31/28; G01R 31/2834; G01R 31/55; G01R 31/69; G01R 35/02
  See application file for complete search history.

(56) References Cited

FOREIGN PATENT DOCUMENTS

| CN | 102798834 | * | 11/2012 | ............. G01R 35/02 |
| CN | 216526249 | * | 5/2022 | ............. G01R 31/69 |

* cited by examiner

*Primary Examiner* — Neel D Shah
(74) *Attorney, Agent, or Firm* — Vladimir Postnikov

(57) ABSTRACT

A detection method for wiring relationship of electrical components is disclosed. An acquisition unit for the wiring relationship of electrical components is used, and the acquisition unit includes a master controller, a control input coding module, a control output coding module, an acquisition signal input and output module, a control input decoding and control analog switch module, a control output decoding and control analog switch module, a relay control wiring separate drive, an acquisition signal module, a wiring terminal module, and also a data transmission module. The detection method can realize multi-point wiring relationship detection technology. A collected wiring relationship of electrical components is restored into a circuit schematic, through comparison a standard circuit diagram with a restored circuit schematic to determine whether correctness of a physical wiring way, which can truly realize a low-level electrical connection line to be transformed into digital electrical circuit equipment for human-computer interaction.

5 Claims, 2 Drawing Sheets

DETECTION METHOD FOR WIRING RELATIONSHIP OF ELECTRICAL COMPONENTS

TECHNICAL FIELD

The present application relates to the technical field of electrical engineering, and in particular to an acquisition unit and a detection method for wiring relationship of electrical components.

BACKGROUND

Currently for detecting wiring relationship of circuit components, a traditional method is to use a multimeter to detect all terminals, but each time two terminals only may be directly measured on-off status, to determine the wiring relationship between the two terminals. If connection of the two terminals is detected, all other terminals except the two terminals also need be detected to finally determine wiring relationship of the all terminals. Alternatively, a traditional sensor is used to detect whether the terminals have been wired, but which cannot determine connection relationship between the terminals. When lines are diversified and combination of multiple changes thereof, the traditional method by means of multimeter detection is quite time-consuming, and the traditional sensor as a signal acquisition cannot identify direction of signals, especially the same endpoint multiple line signals cannot identify and collect signals, thus it will be impossible to achieve digital docking.

Therefore, there is an urgent need for a device applicable to collect signals on the wiring relationship of circuit components, which can collect signals of logical relationship, and process signals of connected wires and connection relationship, so as to realize digital monitoring of wiring relationship of electrical circuits.

SUMMARY

To achieve above objectives, the present disclosure adopts following technical solutions.

In some embodiments of the present disclosure, a detection method for wiring relationship of electrical components is provided, which uses an acquisition unit for the wiring relationship of electrical components to detect. Herein the acquisition unit includes a master controller, a control input coding module, a control output coding module, an acquisition signal input and output module, a control input decoding and control analog switch module, a control output decoding and control analog switch module, a relay control wiring separate drive, an acquisition signal module, a wiring terminal module, and also a data transmission module.

In some embodiments of the present disclosure, the master controller is configured to send a control signal to the control input coding module, and the control input coding module is configured to transmit the control signal to the control input decoding and control analog switch module.

In some embodiments of the present disclosure, the master controller is configured to send the control signal to the control output coding module, and the control output coding module is configured to transmit the control signal to the control output decoding and control analog switch module.

In some embodiments of the present disclosure, the master controller is configured to mutual transmission of signals with the acquisition signal input and output module, and the acquisition signal and output module is configured to send signals transmitted by the master controller to the relay control wiring separate drive.

In some embodiments of the present disclosure, the acquisition signal input and output module is configured to mutual transmission of signals with the acquisition signal module.

In some embodiments of the present disclosure, the acquisition signal module is configured to collect wiring signals from the wiring terminal module and transmit them via the acquisition signal input and output module back to the master controller.

In some embodiments of the present disclosure, the master controller is configured to connect to the data transmission module for signal transmission and exchange and also store data in a server.

In order to improve driving capability of the master controller by using IO driver module, in some preferred embodiments of the present disclosure, the acquisition unit further includes an IO drive module, and the master controller is configured to control the IO drive module, the IO drive module is served as the master controller to send signals to improve signal driving capability and then transmit the signals to the control input coding module and the control output coding module.

In order to store data, in some preferred embodiments of the present disclosure, the acquisition unit further includes a server, and the master controller stores data collected in the server.

For further analysis of results and statistical records, in some preferred embodiments of the present disclosure, the acquisition unit further includes an upper computer. The master controller submits collected information to the upper computer through the data transmission module after preliminary organization, and the upper computer further analyzes the results.

In some embodiments of the present disclosure, the detection method for wiring relationship of electrical components uses the acquisition unit for the wiring relationship of electrical components to detect, and specifically includes following steps S1 to S6.

S1, the master controller, via the IO drive module, transmits output address coding information through the control output coding module to the control output decoding and control analog switch module, the control output decoding and control analog switch module decodes the output address coding information, and then the control output decoding and control analog switch module transmits an output signal decoded through the acquisition signal input and output module to a specified output wiring point.

S2, the master controller, via the IO drive module, transmits input address coding information through the control input coding module to the control input decoding and control analog switch module, the control input decoding and control analog switch module decodes the input address coding information, the control input decoding and control analog switch module assigns an input wiring point for a decoded input signal, and then the acquisition signal input and output module collects an input signal of a current wiring point to determine whether it is consistent with the output signal of S1.

S3, a connection status of a current wiring point address and a corresponding output wiring point address is recorded in response to the input signal of S2 is consistent with the output signal of S1. Alternatively, it is not recorded in response to the input signal of S2 is inconsistent with the output signal of S1.

S4, regardless of whether the input signal and the output signal are consistent, the input address coding information will shift to next address information until an end position of the address information is detected, during detection all points that consistent with the output signal are recorded as a connected array.

S5, the output address will shift back one bit from an address pool after completion a cycle of scanning an output address point and S2 will be repeated again.

S6, a connected array of the wiring relationship in the connected array is transmitted to the upper computer through the master controller and the upper computer restores it into a circuit schematic, a restored circuit schematic is compared with a standard circuit diagram that has been stored in the upper computer to determine whether a wiring of a physical object is correct.

In some preferred embodiments of the present disclosure, during detection, the master controller receives a scanned wiring data from the upper computer and transmits signals to the acquisition signal input and output module.

And the acquisition signal input and output module transmits the signals to the relay control wiring separate drive, the relay control wiring separate drive is engaged with a relay, and a normally open and a normally closed points of the relay allow individual contacts of a line to be detected to be temporarily separated from the electrical components, and then the individual contacts of the line to be detected are connected to the wiring terminal module.

In some preferred embodiments of the present disclosure, the relay is a small intermediate relay.

In some preferred embodiments of the present disclosure, the master controller uses an 8-bit serial input and parallel output chip and an input and output signal selection consisting of 8-bit decoded analog switch.

In some preferred embodiments of the present disclosure, the master controller uses a serial 16-bit serial input and parallel output and a 16-bit decoded analog switch.

Compared with existing technologies, the detection method for wiring relationship of electrical components provided by the present disclosure has at least following advantages and beneficial effects.

The acquisition unit and the detection method for wiring relationship of electrical components of the present disclosure can realize multi-point wiring relationship detection technology, while the low-level acquisition signal module can exchange data with the upper computer that has been written software. A collected wiring relationship of electrical components is restored into a circuit schematic, through comparison the standard circuit diagram with a restored circuit schematic to determine whether correctness of a physical wiring way, which can truly realize a low-level electrical connection line to be transformed into digital electrical circuit equipment for human-computer interaction.

DETAILED DESCRIPTION OF THE EMBODIMENTS

The technical solutions in the embodiments of the present disclosure will be clearly and completely described below in conjunction with accompanying drawings in the embodiments of the present disclosure. Obviously, all described embodiments are only a part of the embodiments of the present disclosure, and are not all of the embodiments of the present disclosure.

Figure 1:
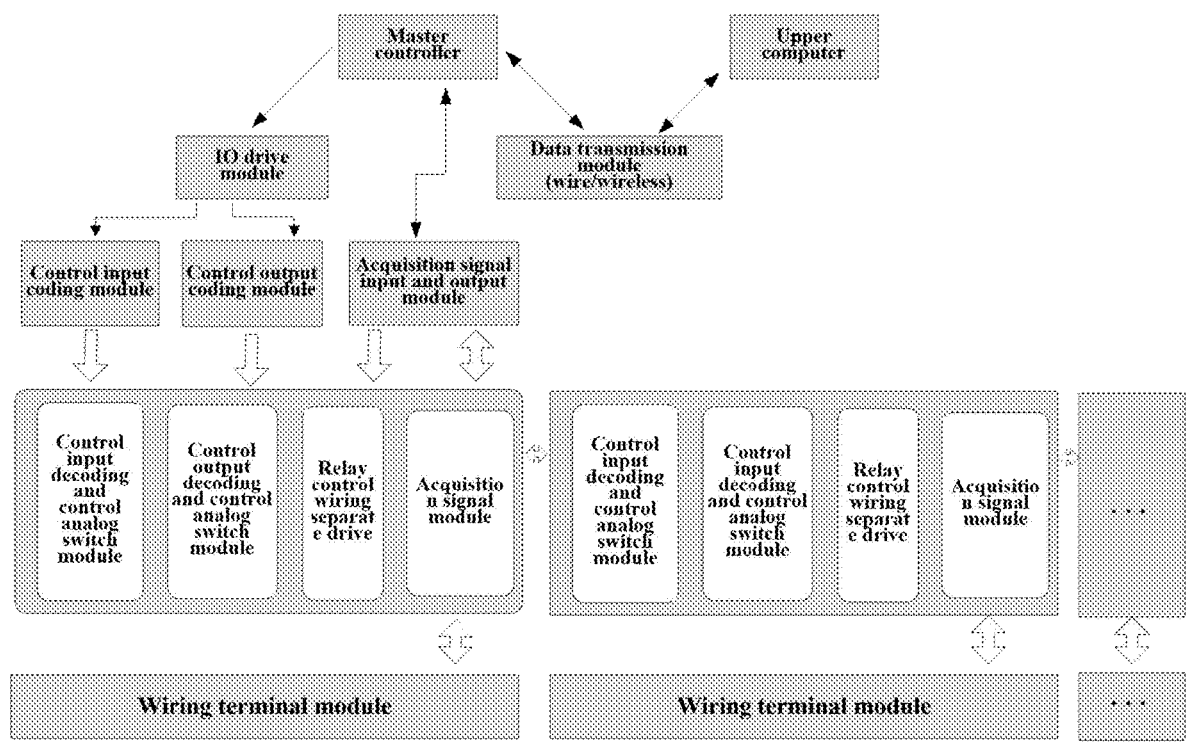
FIG. 1 shows a system diagram of an acquisition unit for wiring relationship of electrical components in accordance with some embodiments of the present disclosure.
Figure 2:
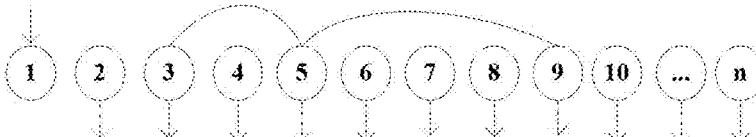
FIG. 2 shows a scanning process schematic diagram of a detection method for wiring relationship of electrical components in accordance with some embodiments of the present disclosure.

Referring to FIGS. 1 to 2, in some embodiments of the present disclosure, an acquisition unit for the wiring relationship of electrical components is provided, which includes a master controller, a control input coding module, a control output coding module, an acquisition signal input and output module, a control input decoding and control analog switch module, a control output decoding and control analog switch module, a relay control wiring separate drive, an acquisition signal module, a wiring terminal module, and also a data transmission module.

In some embodiments of the present disclosure, the master controller is configured to send a control signal to the control input coding module, and the control input coding module is configured to transmit the control signal to the control input decoding and control analog switch module.

In some embodiments of the present disclosure, the master controller is configured to send the control signal to the control output coding module, and the control output coding module is configured to transmit the control signal to the control output decoding and control analog switch module.

In some embodiments of the present disclosure, the master controller is configured to mutual transmission of signals with the acquisition signal input and output module, and the acquisition signal and output module is configured to send signals transmitted by the master controller to the relay control wiring separate drive.

In some embodiments of the present disclosure, the acquisition signal input and output module is configured to mutual transmission of signals with the acquisition signal module.

In some embodiments of the present disclosure, the acquisition signal module is configured to collect wiring signals from the wiring terminal module and transmit them via the acquisition signal input and output module back to the master controller.

In some embodiments of the present disclosure, the master controller is configured to connect to the data transmission module for signal transmission and exchange and also store data in a server.

In some embodiments of the present disclosure, the acquisition unit for the wiring relationship of electrical components further includes a server, an upper computer and an IO drive module, the master controller stores data collected in the server.

In some embodiments of the present disclosure, the master controller is configured to control the IO drive module, the IO drive module is served as the master controller to send signals to improve signal driving capability and then transmit the signals to the control input coding module and the control output coding module. The driving capability of the master controller can be improved by using the IO drive module.

In some embodiments of the present disclosure, the master controller submits collected information through the data transmission module to the upper computer after preliminary organization, and the upper computer further analyzes the results.

The present disclosure adopts digital circuit technology to replace traditional multimeter two-point detection means, by using the IO drive module, the control input coding module is configured to transmit the input address coding information to the control input decoding and control analog switch module, the control input decoding and control analog switch module is configured to decode the input address coding information, the control input decoding and control analog switch module is configured to assign a decoded input signal to an input wiring point. And then using circuit board itself to detect all wiring points on the electrical components, the acquisition signal input and output module collects a signal of a current wiring point to determine whether it is the same as the output signal, which can quickly identify connection status between multiple terminals, thereby obtaining wiring relationship of an entire physical electrical components.

In some embodiments of the present disclosure, the detection method for wiring relationship of electrical components uses the acquisition unit for the wiring relationship of electrical components is used to detect, and specifically described below.

During detection, firstly communication data from the data transmission module and the upper computer is received, and the communication data is analyzed whether it is scanning wiring data, the master controller receives the scanning wiring data from the upper computer, and then the master controller transmits signals to the acquisition signal input and output module.

The acquisition signal input and output module transmits the signals to the relay control wiring separate drive, and the relay control wiring separate drive is engaged with the relay, and a normally open and a normally closed points of the relay allow individual contacts of a line to be detected to be temporarily separated from the electrical components, and then the individual contacts of the line to be detected are connected to the wiring terminal module. In a specific use, a delay time is about 100 ms, so that the relay can complete action execution.

During detection, components and wirings in an original circuit are temporarily disconnected, and the wiring relationship is only collected by the acquisition unit. When the relay is released after exiting the detection, the components and wiring relationship in the circuit will be restored to its original state, and an original function of the circuit will be retained.

S1, the master controller, via the IO drive module, transmits output address coding information through the control output coding module to the control output decoding and control analog switch module, the control output decoding and control analog switch module decodes the output address coding information, and then the control output decoding and control analog switch module transmits an output signal decoded through the acquisition signal input and output module to a specified output wiring point.

S2, the master controller, via the IO drive module, transmits input address coding information (an initial address location is shifted one bit back with respect to the output address) through the control input coding module to the control input decoding and control analog switch module, the control input decoding and control analog switch module decodes the input address coding information, the control input decoding and control analog switch module assigns an input wiring point for a decoded input signal, and then the acquisition signal input and output module collects an input signal of a current wiring point to determine whether it is consistent with the output signal of S1.

S3, a connection status of a current wiring point address and a corresponding output wiring point address is recorded in response to the input signal of S2 is consistent with the output signal of S1. Alternatively, it is not recorded in response to the input signal of S2 is inconsistent with the output signal of S1.

S4, regardless of whether the input signal and the output signal are consistent, the input address coding information will shift to next address information until an end position of the address information is detected, during detection all points that consistent with the output signal are recorded as a connected array.

S5, the output address will shift back one bit from an address pool after completion a cycle of scanning an output address point and S2 will be repeated again.

S6, a connected array of the wiring relationship in the connected array is transmitted to the upper computer through the master controller and the upper computer restores it into a circuit schematic, a restored circuit schematic is compared with a standard circuit diagram that has been stored in the upper computer to determine whether a wiring of a physical object is correct.

Referring to FIG. 2, specific scanning processes of S2 and S3 are described as follows.

A $1^{st}$ point is scanned and a signal is firstly input to the $1^{st}$ point, and then outputs of a $2^{nd}$ point to a $N^{th}$ point are scanned. If a point is found to be consistent with the signal of the $1^{st}$ point, it is recorded, and if it is inconsistent then it is not recorded.

Similarly, a $2^{nd}$ point is scanned and a scanning result indicates that there is no connection relationship with other points.

A $3^{rd}$ point is scanned and a signal is firstly input to the $3^{rd}$ point, and then outputs of a $4^{th}$ point until the $N^{th}$ point are scanned. The scanning result found that a $5^{th}$ and a $9^{th}$ points are consistent with the $3^{rd}$ point, which indicates the wiring relationship is present at the $3^{rd}$, the $5^{th}$ and the $9^{th}$ points.

A $4^{th}$ point is scanned and a signal is firstly input to the $4^{th}$ point, and then starting from scanning a $6^{th}$ point, but skipping the $9^{th}$ point that has been identified of wiring relationship, until the $N^{th}$ point. The scanning result indicates that the $4^{th}$ point has no connection relationship with the other points.

A next point starts at the $6^{th}$ point, automatically skipping points where existence of the wiring relationship has been detected, and in this way continues to complete the scanning detection.

The foregoing description, for purpose of explanation, has been described with reference to specific embodiments. However, the illustrative embodiments above are not intended to be exhaustive or to limit the scope of the claims to the precise forms disclosed. Many modifications and variations are possible in view of the above teachings. The embodiments were chosen in order to best explain the principles underlying the claims and their practical applications, to thereby enable others skilled in the art to best use the embodiments with various modifications as are suited to the particular uses contemplated.

What is claimed is:

1. A detection method for wiring relationship of electrical components,
   wherein the detection method is performed by an acquisition device for the wiring relationship of electrical components, and the acquisition device comprises a master controller, a control input coding module, a control output coding module, an acquisition signal input and output module, a control input decoding and control analog switch module, a control output decoding and control analog switch module, a relay control wiring separate drive, an acquisition signal module, a wiring terminal module, and a data transmission module;

wherein the master controller is configured to send a control signal to the control input coding module, and the control input coding module is configured to transmit the control signal to the control input decoding and control analog switch module;

wherein the master controller is configured to send the control signal to the control output coding module, and the control output coding module is configured to transmit the control signal to the control output decoding and control analog switch module;

wherein the master controller is configured to mutually transmit signals with the acquisition signal input and output module, and the acquisition signal and output module is configured to send signals transmitted by the master controller to the relay control wiring separate drive;

wherein the acquisition signal input and output module is configured to mutually transmit signals with the acquisition signal module;

wherein the acquisition signal module is configured to collect wiring signals from the wiring terminal module, and transmit them via the acquisition signal input and output module back to the master controller;

wherein the master controller is configured to connect to the data transmission module for signal transmission and exchange, and also store data in a server; and wherein the acquisition device further comprises an IO drive module, and the master controller is configured to control the IO drive module, the IO drive module serving as the master controller to send signals to improve signal driving capability and then transmitting the signals to the control input coding module and the control output coding module; and wherein the method specifically comprises steps of S1, the master controller, via the IO drive module, transmits output address coding information through the control output coding module to the control output decoding and control analog switch module;

the control output decoding and control analog switch module decodes the output address coding information; and the control output decoding and control analog switch module transmits an output signal decoded through the acquisition signal input and output module to a specified output wiring point;

S2, the master controller, via the IO drive module, transmits input address coding information through the control input coding module to the control input decoding and control analog switch module;

the control input decoding and control analog switch module decodes the input address coding information;

the control input decoding and control analog switch module assigns an input wiring point for a decoded input signal; and the acquisition signal input and output module collects an input signal of a current wiring point to determine whether it is consistent with the output signal of S1;

S3, the wiring terminal module records a connection status between a current wiring point address and a corresponding output wiring point address in response to the input signal of S2 being consistent with the output signal of S1; and the wiring terminal module does not record the connection status between the current wiring point address and the corresponding output wiring point address in response to the input signal of S2 being inconsistent with the output signal of S1;

S4, regardless of whether the input signal and the output signal are consistent, the master controller, via the IO drive module, shifts the input address coding information to next address information until an end position of the address information is detected, wherein during detection all points that consistent with the output signal are recorded as a connected array;

S5, the master controller via the IO drive module, shifts the output address back one bit from an address pool after completion a cycle of scanning an output address point, and S2 will be repeated to perform; and, S6, the acquisition signal input and output module transmits a connected array of the wiring relationship in the connected array to an upper computer through the master controller and the upper computer restores it into a circuit schematic, a restored circuit schematic is compared with a standard circuit diagram that has been stored in the upper computer to determine whether a wiring of a physical object is correct.

2. The detection method for wiring relationship of electrical components according to claim 1, wherein during detection, the master controller receives a scanned wiring data from the upper computer and transmits signals to the acquisition signal input and output module; and the acquisition signal input and output module transmits the signals to the relay control wiring separate drive, the relay control wiring separate drive is engaged with a relay, and normally open and a normally closed points of the relay allow individual contacts of a line to be detected to be temporarily separated from the electrical components, and then the individual contacts of the line to be detected are connected to the wiring terminal module.

3. The detection method for wiring relationship of electrical components according to claim 2, wherein the relay is a small intermediate relay.

4. The detection method for wiring relationship of electrical components according to claim 2, wherein the master controller uses an 8-bit serial input and parallel output chip and an input and output signal selection consisting of 8-bit decoded analog switch.

5. The detection method for wiring relationship of electrical components according to claim 2, wherein the master controller uses a serial 16-bit serial input and parallel output and a 16-bit decoded analog switch.

* * * * *